United States Patent
Kondo et al.

(10) Patent No.: US 6,833,617 B2
(45) Date of Patent: Dec. 21, 2004

(54) COMPOSITE MATERIAL INCLUDING COPPER AND CUPROUS OXIDE AND APPLICATION THEREOF

(75) Inventors: Yasuo Kondo, Hitachinaka (JP); Junya Kaneda, Hitachi (JP); Tasuhisa Aono, Hitachi (JP); Teruyoshi Abe, Hitachi (JP); Masahisa Inagaki, Hitachi (JP); Ryuichi Saito, Hitachi (JP); Yoshihiko Koike, Hitachinaka (JP); Hideo Arakawa, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/364,460

(22) Filed: Feb. 12, 2003

(65) Prior Publication Data

US 2003/0146498 A1 Aug. 7, 2003

Related U.S. Application Data

(62) Division of application No. 09/485,227, filed on Dec. 8, 2001.

(51) Int. Cl.<sup>7</sup> ............................................. H01L 23/10
(52) U.S. Cl. ..................................... 257/707; 257/706
(58) Field of Search ............................... 257/702, 703, 257/706, 707, 746, 762

(56) References Cited

U.S. PATENT DOCUMENTS

| | | | |
|---|---|---|---|
| 3,768,634 A | 10/1973 | Babcock et al. | |
| 4,290,080 A | 9/1981 | Hysell et al. | 357/81 |
| 4,385,310 A | 5/1983 | Houston | 357/68 |
| 4,497,875 A | * 2/1985 | Arakawa et al. | 428/620 |

(List continued on next page.)

FOREIGN PATENT DOCUMENTS

| | | |
|---|---|---|
| EP | 0 425 073 | 7/1990 |
| EP | 0 475 575 | 5/1991 |
| JP | 57-109205 | 7/1982 |
| JP | 4-41601 | 2/1992 |
| JP | 57-181344 | 11/1992 |

OTHER PUBLICATIONS

Abstract in English—Japanese document 09–015773; Jan. 17, 1997.
Abstract of JP03–271339 (Dec. 3, 1991).
English translation of JP 50–51908.
Abstract of JP 01–106451 (Apr. 24, 1989).
Communication dated Dec. 19, 2003; Application No. 98 957 211.0.
Supplementary European Search Report mailed Dec. 27, 2002, for EP 98 957 211.
Communication from EPO May 2, 2003 for Application No. 98 957 211.0.

*Primary Examiner*—Roy Potter
(74) *Attorney, Agent, or Firm*—Antonelli, Terry, Stout & Kraus, LLP

(57) ABSTRACT

It is an object of the present invention to provide a composite material having low thermal expansivity, high thermal conductivity, and good plastic workability, which is applied to semiconductor devices and many other uses.

The composite material is composed of metal and inorganic particles having a smaller coefficient of thermal expansion than said metal. It is characterized in that said inorganic particles disperse in such a way that 95% or more of them (in terms of their area in cross-section) form aggregates of complex configuration joining together.

The composite material contains 20–80 vol % of copper oxide, with the remainder being copper. It has a coefficient of thermal expansion of $5\times10^{-6}$ to $14\times10^{-6}/°$ C. and thermal conductivity of 30–325 W/m·K in the range of room temperature to 300° C. It is suitable for the radiator plate of semiconductor devices and the dielectric plate of electrostatic attractors.

12 Claims, 15 Drawing Sheets

U.S. PATENT DOCUMENTS

| | | | |
|---|---|---|---|
| 4,892,581 A | * 1/1990 | Sheinberg et al. | 75/232 |
| 5,374,391 A | 12/1994 | Kuwabara et al. | |
| 5,432,675 A | 7/1995 | Sorimachi et al. | 361/719 |
| 5,490,627 A | 2/1996 | Krum et al. | |
| 5,609,799 A | * 3/1997 | Shima et al. | 264/12 |
| 5,637,897 A | 6/1997 | Oyama | 257/320 |
| 6,630,734 B2 | * 10/2003 | Okamoto et al. | 257/707 |

* cited by examiner (×1000)

COMPOSITE MATERIAL INCLUDING COPPER AND CUPROUS OXIDE AND APPLICATION THEREOF

This is a divisional of parent application Ser. No. 09/485,227, filed Dec. 18, 2001, the entire disclosure of which is hereby incorporated by reference.

TECHNICAL FIELD

The present invention relates to a composite material with low thermal expansivity and high thermal conductivity, to a process for production thereof, and to applications thereof such as semiconductor devices.

BACKGROUND ART

Power electronics include a technique which deals with power electronic devices to convert and control electric power and energy, power electronic devices used in on-off mode, and a power conversion system as its application technique.

Conversion of electric power calls for a variety of power semiconductors with switching capability. These semiconductors in practical use include rectifier diodes (with a pn junction for current flow in only one direction), and thyristors, bipolar transistors, and MOSFETs (with a combination of pn junctions). Recently developed ones include insulated gate bipolar transistors (IGBT) and gate turn-off thyristors (GTO) which perform switching in response to gate signals.

These power semiconductors evolve heat when energized. They tend to evolve more heat with their increasing capacity and speed. To protect them from deterioration and life-shortening due to heat evolution, they should be provided with a radiator which prevents temperature rise in themselves and in their vicinity. A common material used for radiators is copper, which is inexpensive and has high thermal conductivity (393 W/m). Unfortunately, copper is not suitable for the radiator of power semiconductor devices because it has a high thermal expansivity of $17 \times 10^{-6}/°$ C. and hence it is not soldered well with silicon whose thermal expansivity is $4.2 \times 10^{-6}/°$ C. One way to address this problem is to make the radiator from molybdenum or tungsten which has thermal expansivity close to that of silicon or to interpose it between the radiator and the semiconductor element.

Power semiconductor elements are contrasted with electronic semiconductor elements. The latter are exemplified by integrated circuits (IC) consisting of electronic circuits integrally formed on a single semiconductor chip. They are classified into memory, logic, microprocessors, etc. according to their functions. A problem involved with recent electronic semiconductor elements is heat evolution, which increases as the degree of integration increases and the speed of operation increases. To make things worse, electronic semiconductor elements are contained individually in hermetic packages for isolation from the atmosphere to prevent failure and deterioration. Widespread packages are ceramic packages (in which each semiconductor element is fixed to ceramics through die bonding) and plastics packages (which are sealed with plastics). A new development to meet requirements for high reliability and high speed operation is the multi-chip module (MCM) equipped with a plurality of semiconductor elements on a single substrate.

A plastics package is constructed such that the semiconductor element therein has its terminals connected to the lead frame through bonding wires and the entire assembly is sealed with plastics. Recent improvements made to cope with increasing heat evolution are packages in which the lead frame functions to dissipate heat or which are provided with a radiator for heat dissipation. The lead frame or radiator for heat dissipation is usually made of copper with high thermal conductivity. Unfortunately, malfunction is anticipated because of difference in thermal expansivity between copper and silicon.

By contrast, ceramics packages are constructed such that a semiconductor element is placed on a ceramic substrate having wiring printed thereon and the entire assembly is sealed with a metal or ceramics cap. The ceramic substrate is backed with Cu—Mo or Cu—W composite material or kovar alloy, which functions as a radiator. Ceramic materials with low thermal expansivity, high thermal conductivity, and good workability are required at low production cost.

An MCM consists of a metal or ceramic substrate having thin film wiring formed thereon, a plurality of semiconductor elements (in the form of bare chip) mounted thereon, a ceramic package containing them, and a sealing lid. The package is provided with a radiator or fin if it needs heat dissipation. The metal substrate is made of copper or aluminum. The have the advantage of high thermal conductivity but also have the disadvantage of high thermal expansivity, which leads to poor matching with the semiconductor element. Therefore, the substrate of MCMs for high reliability is made of silicon or aluminum nitride (AlN). The radiator, which is bonded to the ceramic package, should be made of a material which has high thermal conductivity and also has low thermal expansivity for good matching with the package material.

As mentioned above, all semiconductor devices evolve heat during operation and are subject to malfunction if heat is accumulated. Therefore, they need a radiator with good thermal conductivity for heat dissipation. The radiator, which is bonded to the semiconductor element directly or indirectly through an insulating layer, calls for not only high thermal conductivity but also low thermal expansivity for good matching with the semiconductor element.

Prevailing semiconductor elements are based on Si or GaAS, which have a coefficient of thermal expansion of $2.6 \times 10^{-6}$ to $3.6 \times 10^{-6}/°$ C. and $5.7 \times 10^{-6}$ to $6.9 \times 10^{-6}/°$ C., respectively. Among known materials comparable to them in thermal expansivity are AlN, SiC, Mo, W, and Cu—W. When used alone for radiators, they do not permit their heat transfer coefficient and thermal conductivity to be controlled as desired. They are poor in workability and high in production cost. A Cu—Mo sintered alloy is proposed in Japanese Patent Laid-open No. Hei 8-78578. A Cu—W—Ni sintered alloy is proposed in Japanese Patent Laid-open No. Hei 9-181220. A Cu—SiC sintered alloy is proposed in Japanese Patent Laid-open No. Hei 9-209058. An Al—SiC composite material is proposed in Japanese Patent Laid-open No. Hei 9-15773. These conventional composite materials permit their heat transfer coefficient and thermal conductivity to be controlled over a broad range if the ratio of their constituents is changed. However, they are poor in plastic workability and hence they present difficulties in making into thin plate and need many manufacturing steps.

It is an object of the present invention to provide a composite material having low thermal expansivity, high thermal conductivity, and good plastic workability, a semiconductor device made with said composite material, a radiator for said semiconductor device, an electrostatic attractor, and a dielectric plate for said electrostatic attractor.

DISCLOSURE OF INVENTION

The first aspect of the present invention resides in a composite material composed of metal and inorganic particles having a smaller coefficient of thermal expansion than said metal, characterized in that said inorganic particles disperse in such a way that 95% or more of them (in terms of their area in cross-section) form aggregates of complex configuration joining together.

The second aspect of the present invention resides in a composite material composed of metal and inorganic particles having a smaller coefficient of thermal expansion than said metal, characterized in that said inorganic particles are individually present such that they count 100 or less in a sectional area of 100 μm square, with the remainder dispersing in the form of aggregates of complex configuration joining together.

The third aspect of the present invention resides in a composite material composed of metal and inorganic particles having a smaller coefficient of thermal expansion than said metal, characterized in that said inorganic particles are have a Vickers hardness of 300 or less. The fourth aspect of the present invention resides in a composite material composed of metal and inorganic particles having a smaller coefficient of thermal expansion than said metal, said composite material having a coefficient of thermal expansion which increases by 0.025–0.035 ppm/° C. on average per W/m·K at 20° C. in the range of 20–105° C.

The fifth aspect of the present invention resides in a composite material composed of metal and inorganic particles having a smaller coefficient of thermal expansion than said metal, characterized in that said inorganic particles disperse in the form of aggregates joining together, said aggregates elongating in the direction of plastic working.

The sixth aspect of the present invention resides in a composite material composed of copper and copper oxide particles, characterized in that said copper oxide particles disperse in such a way that 95% or more of them (in terms of their area in cross-section) form aggregates of complex configuration joining together.

The seventh aspect of the present invention resides in a radiator plate for a semiconductor device which is made of said composite material.

The eighth aspect of the present invention resides in a radiator plate for a semiconductor device which has a nickel plating layer thereon.

The ninth aspect of the present invention resides in a semiconductor device which comprises a plurality of insulating substrates and a plurality of semiconductor elements mounted on each of said insulating substrates, each of said insulating substrates having said radiator plate directly joined to said insulating substrate through a conductive layer formed on the upper and lower surfaces of said insulating substrate.

The tenth aspect of the present invention resides in a semiconductor device which comprises an insulating substrate with a radiator plate and a semiconductor element mounted on said insulating substrate, wherein said radiator plate is the one defined in the seventh or eighth aspect.

The eleventh aspect of the present invention resides in a semiconductor device which comprises a semiconductor element mounted on a radiator plate, a lead frame joined to said radiator plate, and metal wiring to electrically connect said lead frame with said semiconductor element, said semiconductor element being sealed with plastics, wherein said radiator-plate is the one defined in the seventh or eighth aspect.

The twelfth aspect of the present invention resides in a semiconductor device which comprises a semiconductor element mounted on a radiator plate, a lead frame joined to said radiator plate, and metal wiring to electrically connect said lead frame with said semiconductor element, said semiconductor element being sealed with plastics and said radiator plate being open at the side opposite to the side to which said semiconductor element is joined, wherein said radiator plate is the one defined in the seventh or eighth aspect.

The thirteenth aspect of the present invention resides in a semiconductor device which comprises a semiconductor element mounted on a radiator plate, pins for connection with external wiring, a ceramics multilayer wiring substrate having at its center an open space to hold said semiconductor element, and metal wiring to electrically connect said semiconductor element with the terminals of the substrate, said radiator plate and said substrate being joined to each other such that said semiconductor element is installed in said space and said substrate being joined to a lid such that said semiconductor element is isolated from the atmosphere, wherein said radiator plate is the one defined in the seventh or eighth aspect.

The fourteenth aspect of the present invention resides in a semiconductor device which comprises a semiconductor element mounted on a radiator plate, terminals for connection with external wiring, a ceramics multilayer wiring substrate having at its center a recess to hold said semiconductor element, and metal wiring to electrically connect said semiconductor element with the terminals of the substrate, said radiator plate and the recess of said substrate being joined to each other such that said semiconductor element is installed in said recess and said substrate being joined to a lid such that said semiconductor element is isolated from the atmosphere, wherein said radiator plate is the one defined in the seventh or eighth aspect.

The fifteenth aspect of the present invention resides in a semiconductor device which comprises a radiator plate, a semiconductor element joined onto said radiator plate with a thermally conductive resin, a lead frame joined to a ceramics insulating substrate, and a TAB to electrically connect said semiconductor element with the lead frame, said radiator plate and said substrate being joined to each other such that said semiconductor element is isolated from the atmosphere, and said semiconductor element and said insulating substrate being separated by a thermally conductive elastic resin interposed between them, wherein said radiator plate is the one defined in the seventh or eighth aspect.

The sixteenth aspect of the present invention resides in a semiconductor device which comprises a first radiator plate, a semiconductor element joined to said radiator plate with metal, a second radiator plate joined to a grounding plate, said first radiator plate being mounted on the grounding plate of the radiator plate, and a TAB electrically connected to the terminals of said semiconductor element, said semiconductor element being sealed with plastics, wherein said radiator plate is the one defined in the seventh or eighth aspect.

The seventeenth aspect of the present invention resides in a dielectric plate for electrostatic attractors which is made of the composite material defined in any of the first to sixth aspects mentioned above.

The eighteenth aspect of the present invention resides in an electrostatic attractor which comprises an electrode layer and a dielectric plate bonded to said electrode layer, said dielectric producing an electrostatic attractive force upon application of a voltage to said electrode layer such that an object is fixed onto the surface of said dielectric plate, wherein said dielectric plate is the one defined in the seventeenth aspect.

The composite material according to the present invention is composed of metal and inorganic particles. The metal includes Au, Ag, Cu, and Al, among which Cu is the most desirable because of its high melting point and high strength. The inorganic particles should preferably be those which are comparatively soft and stable after sintering and have an average coefficient of thermal expansion equal to or smaller than $5.0 \times 10^{-6}/°$ C., preferably equal to or smaller than $3.5 \times 10^{-6}/°$ C., in the range of 20–150° C., and also have a Vickers hardness of 300 or less. (They are different from conventional ones., such as SiC and $Al_2O_3$, which greatly differ in hardness from the matrix metal.) Such soft inorganic particles provide good plastic workability (either hot or cold) after sintering. Rollability makes it possible to produce a comparatively thin plate in a short processing time. The resulting composite material has a high strength because of the inorganic particles dispersed therein. Conceivable examples of the inorganic particles include copper oxide, tin oxide, lead oxide, and nickel oxide. Of these examples, copper oxide is preferably because of the smallest coefficient of thermal expansion.

The composite material of the present invention should preferably be reinforced with hard, fine ceramics particles, such as SiC and $Al_2O_3$, having a Vickers hardness of 1000 or more and an average particle diameter of 3 $\mu$m or less, in an amount of 5 vol % or less.

The radiator plate and dielectric plate according to the present invention may be obtained in its final shape by sintering, optional rolling, and plastic working (such as pressing).

The composite material according to the present invention should preferably be a copper (Cu) alloy containing cuprous oxide ($Cu_2O$) in an amount of 20–80 vol %, with the Cu phase and the $Cu_2O$ phase forming the dispersing structure. The composite material should preferably have a coefficient of thermal expansion of $5 \times 10^{-6}$ to $14 \times 10^{-6}/°$ C. and a thermal conductivity of 30–325 W/m·K in the range of room temperature to 300° C.

The copper-cuprous oxide composite material should preferably contain cuprous oxide ($Cu_2O$) in an amount of 20–80 vol %, with the remainder being copper (Cu). The $Cu_2O$ phase and the Cu phase should have an oriented structure. The composite material should preferably have a coefficient of thermal expansion of $5 \times 10^{-6}$ to $14 \times 10^{-6}/°$ C. and a thermal conductivity of 30–325 W/m·K in the range of room temperature to 300° C. The thermal conductivity in the direction of orientation should be greater than twice that in the direction perpendicular to the direction of orientation.

The composite material according to the present invention is produced by steps of mixing copper powder and cuprous oxide powder, pressing the mixed powder, sintering the pressed form at 800–1050° C., and performing cold or hot plastic working. (Copper powder is an example of said metal and cuprous oxide powder is an example of said inorganic particles.)

The copper composite material according to the present invention is produced from a mixed powder of cupric oxide (CuO) and copper (Cu) containing inevitable impurities. The amount of cupric oxide is 10.8–48.8 vol %. The production process consists of steps of press-forming the mixed powder, sintering the pressed form at 800–1050° C., thereby solidifying the pressed form and forming $Cu_2O$ by reaction between CuO and Cu, hot or cold pressing (for plastic working), and annealing.

The copper composite material of the present invention is composed of Cu and $Cu_2O$, the former having a high coefficient of thermal expansion of $17.6 \times 10^{-6}/°$ C. and a thermal conductivity as high as 391 W/m·K, the latter having a low coefficient of thermal expansion of $2.7 \times 10^{-6}/°$ C. and a thermal conductivity of 12 W/m·K. It is formed into a radiator plate for semiconductor devices by sintering. The sintered body is composed of Cu and $Cu_2O$ in an amount of 20–80 vol %. It has a coefficient of thermal expansion of $5 \times 10^{-6}$ to $14 \times 10^{-6}/°$ C. and a thermal conductivity of 30–325 W/m·K in the range of room temperature to 300° C. With $Cu_2O$ in an amount of 20% or more, the composite material has a high coefficient of thermal conductivity required of the radiator plate. With $Cu_2O$ in an amount of 80% or less, the composite material has sufficient thermal conductivity and structural strength.

The composite material according to the present invention is obtained basically by powder metallurgy. The copper composite material is obtained from Cu powder and $Cu_2O$ powder or CuO powder. These powders (as raw materials) are mixed in a prescribed ratio, the mixed powder is cold-pressed in a mold, and the resulting preform is sintered. If necessary, the sintered body undergoes hot or cold plastic working.

The mixing of raw material powders is accomplished by using a V-mixer, pot mill, or mechanical alloying. The particle size of the raw material powders affect the press molding performance and the dispersibility of $Cu_2O$ after sintering. Therefore, the Cu powder should have a particle diameter of 100 $\mu$m or less, and the $Cu_2O$ and CuO powder should have a particle diameter of 10 $\mu$m or less, preferably 1–2 $\mu$m.

The mixed powder undergoes cold pressing in a mold under a pressure of 400–1000 kg/cm². The pressure should preferably be increases in proportion to the $Cu_2O$ content.

The preform of the mixed powder is sintered is an argon atmosphere under normal pressure or sintered by HIP or hot pressing under pressure. Sintering should be carried out at 800–1050° C. for about 3 hours. The sintering temperature should be increased in proportion to the $Cu_2O$ content. The sintering temperature varies depending on the kind of the matrix metal. In the case of copper, the sintered body will have a low density if the sintering temperature is 800° C. or less. In addition, sintering at a temperature of 1050° C. or more brings about a eutectic reaction between Cu and $Cu_2O$, which would result in partial melting. Therefore, the adequate sintering temperature ranges from 900° C. to 1000° C.

The copper composite material according to the present invention is composed of Cu and $Cu_2O$, which have a low hardness. Therefore, it is capable of cold or hot working, such as rolling and forging, which is carried out after sintering, if necessary. Working leads to anisotropic thermal conductivity, which contributes to strength or some applications which need heat conduction in a specific direction.

According to the present invention, the raw material powder may be CuO. This CuO powder is mixed with Cu powder and the mixed powder is press-formed. The resulting preform is sintered so that Cu is oxidized. Thus there is obtained a sintered body which is composed of a matrix of Cu and a dispersed phase of $Cu_2O$. CuO coexisting with Cu transforms into $Cu_2O$ (which is thermal stable) at high temperatures according to equation (1) below.

$$2Cu + CuO \rightarrow Cu + Cu_2O \qquad (1)$$

A certain length of time is required before an equilibrium is reached in the reaction represented by the equation (1). About 3 hours will be sufficient if the sintering temperature is 900° C.

$Cu_2O$ particles in the sintered body should be as fine as possible because their particle diameter affects the density, strength, and plastic workability of the composite material. The particle diameter is greatly affected by the mixing method. The larger the mixing energy, the less the coagulation of powder particles. Thus fine $Cu_2O$ particles are obtained after sintering.

According to the present invention, the particle size of the $Cu_2O$ phase is established as follows depending on the mixing machine employed. 50 vol % or more of particles should have a particle diameter of 50 μm or less if a V-mixer is used (with small mixing energy), a particle diameter of 50 μm or less if a pot mill containing steel balls is used, and a particle diameter of 10 μm or less if mechanical alloying (with the largest mixing energy) is employed, with the remainder having a particle diameter of 50–200 μm. With a particle diameter of 200 μm or more, the resulting composite material has high porosity and hence is poor in plastic workability. With a content of $Cu_2O$ phase in excess of 50 vol %, the resulting composite material is low in thermal conductivity and uneven in characteristic properties and hence it is inadequate for use as the radiator plate for semiconductor devices. A preferred structure is one which is composed of a Cu phase and a $Cu_2O$ phase (50 μm or less) uniformly dispersed therein. $Cu_2O$ particles have an extremely irregular shape and are joined together before sintering; their particle diameter before sintering can be observed with a high magnification. The $Cu_2O$ phase should preferably 10 μm or less.

BEST MODE FOR CARRYING OUT THE INVENTION

EXAMPLE 1

Figure 1:
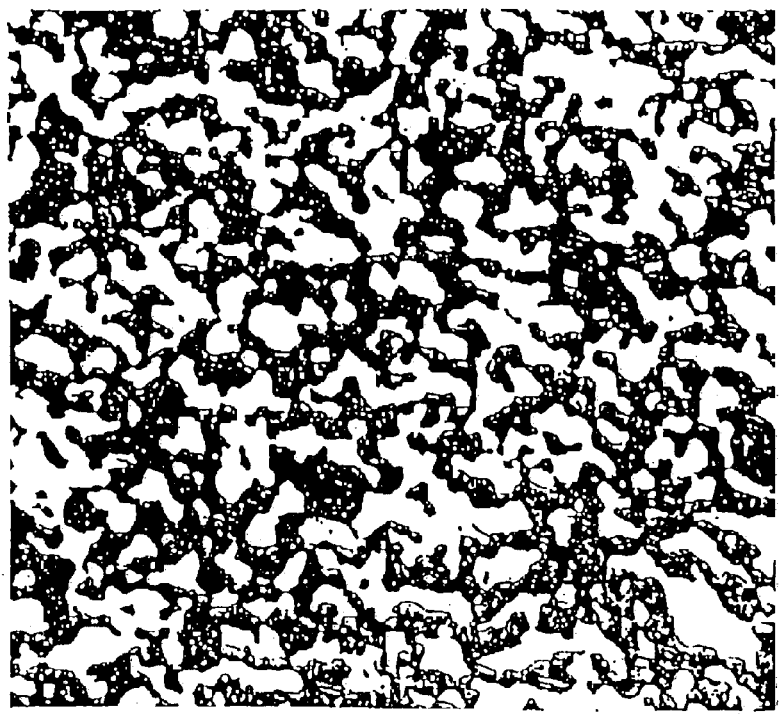
FIG. 1 is an optical photomicrograph showing the microstructure of the sintered body (composed of Cu and 55 vol % of $Cu_2O$) in Example 1 (sample No. 4) of the present invention.

Raw material powders used in this example are electrolytic copper powder (with a particle diameter of 75 μm or less) and $Cu_2O$ powder (with a particle diameter of 1–2 μm and a purity of 3N). They were mixed in a ratio shown in Table 1. The resulting mixture (1400 g) was thoroughly mixed for more than 10 hours in a dry pot mill containing steel balls. The resulting mixed powder was placed in a mold, 150 mm in diameter, and cold-pressed under a pressure of 400–1000 kg/cm² depending on the $Cu_2O$ content. Thus there were obtained preforms measuring 150 mm in diameter and 17–19 mm in height. The preforms were sintered in an argon atmosphere. The resulting sintered bodies were chemically analyzed, examined for structure, and measured for thermal expansivity, thermal conductivity, and Vickers hardness. Incidentally, sintering was carried out for 3 hours at 900–1000° C. depending on the $Cu_2O$ content. The thermal expansivity was measured in the range of room temperature to 300° C. by using an apparatus for TMA (Thermal Mechanical Analysis). The thermal conductivity was measured by laser flash method. The results are shown in Table 1. The sintered body (sample No. 4) has the microstructure as shown in FIG. 1.

The results of chemical analysis indicated that the composition of the sintered body agrees with the ratio of mixing. It is apparent from Table 1 that the thermal expansivity and thermal conductivity vary over a broad range depending on the ratio of Cu and $Cu_2O$. Therefore, it was possible to produce the sintered body with thermal characteristics required of the radiator plate.

TABLE 1

| No. | Composition (vol%) | | Coefficient of thermal expansion ($\times 10^{-6}$/° C.) | Thermal conductivity (W/m · K) |
| --- | --- | --- | --- | --- |
| | Cu | $Cu_2O$ | | |
| 1 | 20 | 80 | 5.5 | 41 |
| 2 | 30 | 70 | 7.0 | 63 |
| 3 | 40 | 60 | 8.4 | 93 |

TABLE 1-continued

| No. | Composition (vol%) | | Coefficient of thermal expansion ($\times 10^{-6}/°$ C.) | Thermal conductivity (W/m · K) |
|---|---|---|---|---|
| | Cu | $Cu_2O$ | | |
| 4 | 45 | 55 | 9.3 | 116 |
| 5 | 50 | 50 | 10.1 | 138 |
| 6 | 60 | 40 | 10.8 | 183 |
| 7 | 70 | 30 | 12.9 | 229 |
| 8 | 80 | 20 | 13.8 | 280 |

The photomicrograph (×300) shown in FIG. 1 indicates the microstructure in which $Cu_2O$ particles are 50 μm or less and the $Cu_2O$ phase is uniformly dispersed in the Cu phase. (The $Cu_2O$ particles coagulate in the mixing step and slightly grow in the sintering step.) In the photomicrograph, the white part represents the Cu phase and the black part represents the $Cu_2O$ phase.

It is noted from FIG. 1 that $Cu_2O$ particles disperse in irregular form, accounting for 99% or more of the sectional area.

The Cu phase and the $Cu_2O$ phase have a hardness (Hv) of 210–230 and 75–80, respectively. The resulting sintered body has good machinability (latheing and drilling) and can be readily shaped as desired.

EXAMPLE 2

The same procedure as in Example 1 was repeated except that mixing was carried out by using a V-mixer. There was obtained a sintered body composed of Cu and 55 vol % of $Cu_2O$. This sintered body was examined for microstructure, thermal expansivity, and thermal conductivity in the same way as in Example 1.

Figure 2:
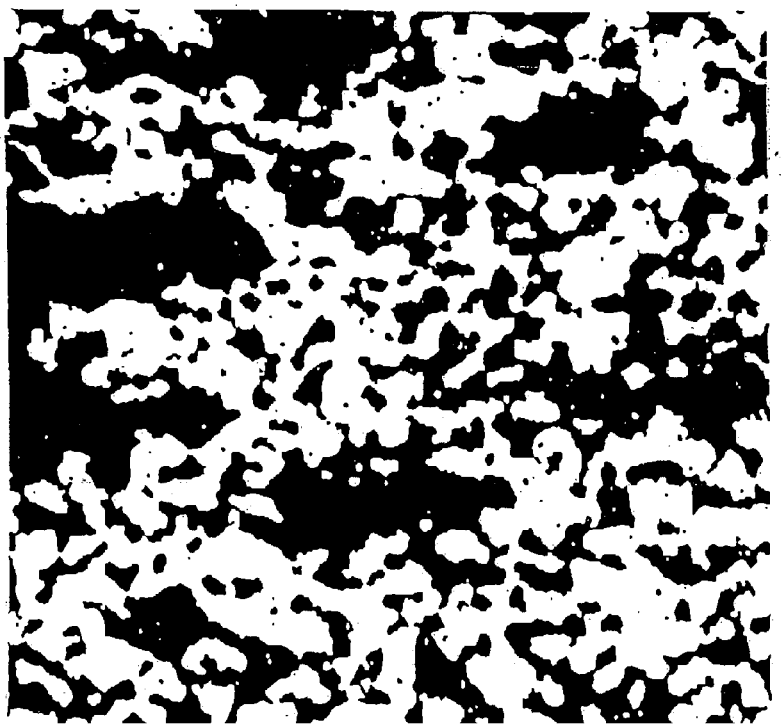
FIG. 2 is an optical photomicrograph showing the microstructure of the sintered body (composed of Cu and 55 vol % of $Cu_2O$) in Example 2 of the present invention.

FIG. 2 is a photomicrograph (×300) of the sintered body composed of Cu and 55 vol % of $Cu_2O$. It is apparent from the photomicrograph that the microstructure contains $Cu_2O$ particles greatly varying in size. Large $Cu_2O$ particles are formed by coagulation during mixing in the V-mixer. The sintered body in this example is almost comparable in thermal expansivity and thermal conductivity to that of the same composition in which the $Cu_2O$ phase is uniformly dispersed in the Cu phase. However, the measured values vary from one position to another. It is noted that $Cu_2O$ particles are dispersed mostly in irregular shape as in FIG. 1 but they are in larger aggregates than those in FIG. 1.

EXAMPLE 3

Raw material powders used in this example are electrolytic copper powder (with a particle diameter of 74 μm or less) and CuO powder (with a particle diameter of 1–2 μm and a purity of 3N). They were mixed to establish a composition of Cu and 22.4 vol % of CuO. The resulting mixture (300 g) was thoroughly mixed by mechanical alloying for 25 hours in a planetary ball mill (120 mm in diameter) containing steel balls (8 mm in diameter). The resulting mixed powder was placed in a mold, 80 mm in diameter, and cold-pressed under a pressure of 1000 kg/cm². Thus there was obtained a preform. The preform was sintered in an argon atmosphere at 800° C. for 2 hours. The resulting sintered body was examined for structure, thermal expansivity, and thermal conductivity in the same way as in Example 1. It was also tested by X-ray diffractometry.

Figure 3:
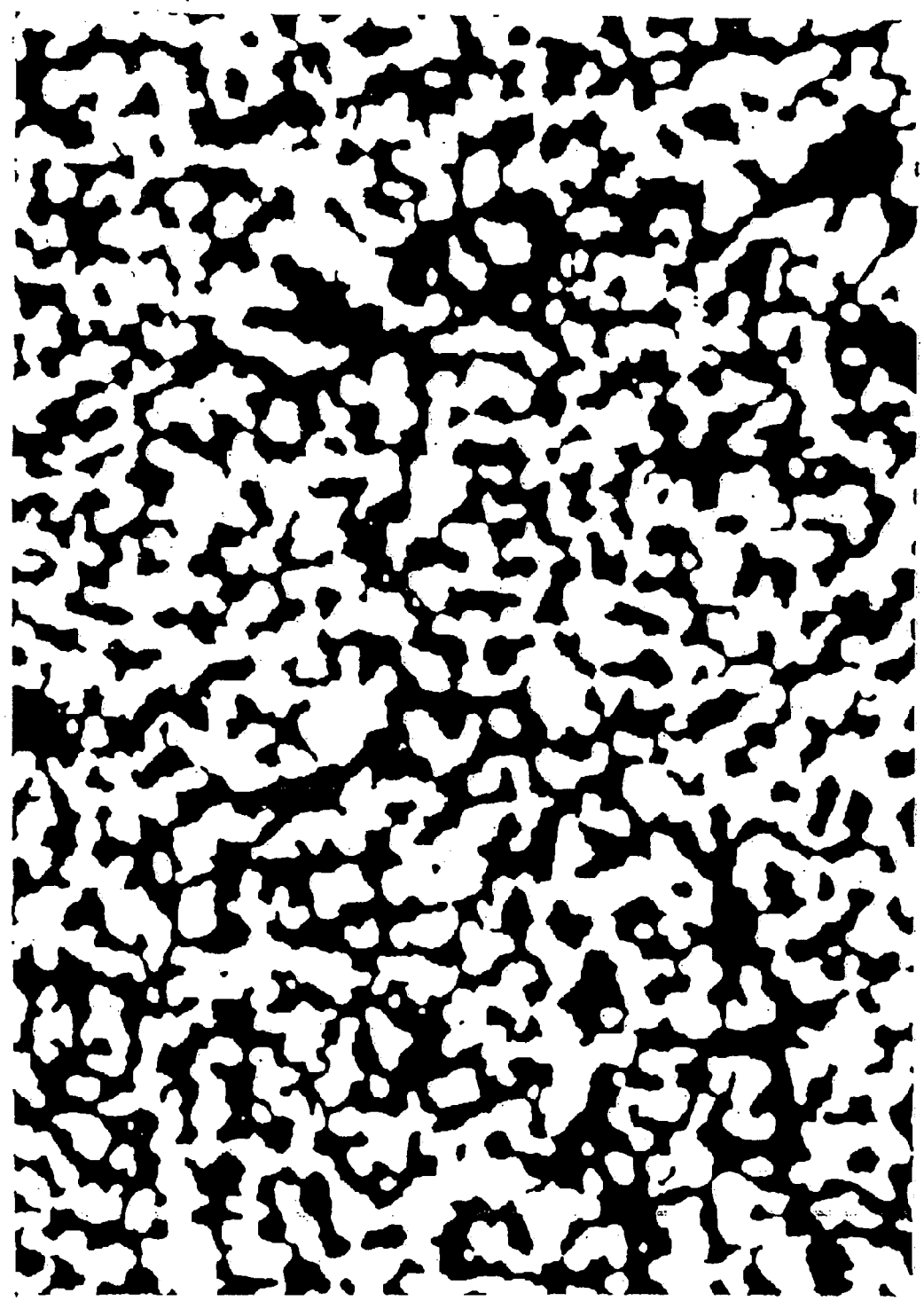
FIG. 3 is an optical photomicrograph showing the microstructure of the sintered body (composed of Cu and 40 vol % of $Cu_2O$) in Example 3 of the present invention.

FIG. 3 is a photomicrograph (×1000) of the microstructure of the sintered body. It is apparent from the photomicrograph that $Cu_2O$ particles are finer than those in Examples 1 and 2 and $Cu_2O$ particles of 10 μm or less are uniformly dispersed. The fine microstructure is desirable for improvement in strength and cold rollability. It is noted that 95% or more of $Cu_2O$ particles are dispersed in irregular shape as in FIG. 1 but some of them are present in the form of spherical particles (about 20 particles in an area of 100 μm square).

The sintered body was tested by X-ray diffractometry to identity oxides contained therein. The diffraction peak is due to $Cu_2O$ only. This suggests that CuO has completely transformed into $Cu_2O$ during sintering. The results of chemical analysis indicate that the sintered body is composed of Cu and 40 vol % of $Cu_2O$ as intended.

The sintered body was found to have the same thermal expansivity and thermal conductivity as those of the sinter body of the same composition in Example 5 mentioned later.

EXAMPLE 4

Raw material powders used in this example are the same those used in Example 1. They were mixed to establish a composition of Cu and 55 vol % of $Cu_2O$. The resulting mixture (550 g) was thoroughly mixed in a V-mixer. The resulting mixed powder was placed in a mold, 80 mm in diameter, and cold-pressed under a pressure of 600 kg/cm². Thus there was obtained a preform measuring 80 mm by 22 mm. The preform was sintered in an argon atmosphere at 975° C. for 3 hours. The resulting sintered body was heated to 800° C. and forged (with a forging ratio of 1.8) using a 200-ton press. Forging was follows by tempering and annealing at 500° C. The resulting product was examined for structure, thermal expansivity, and thermal conductivity in the same way as in Example 1.

The forged product was found to be satisfactory except for slight edge cracking. The copper composite material of the present invention is superior in plastic workability.

Figure 4:
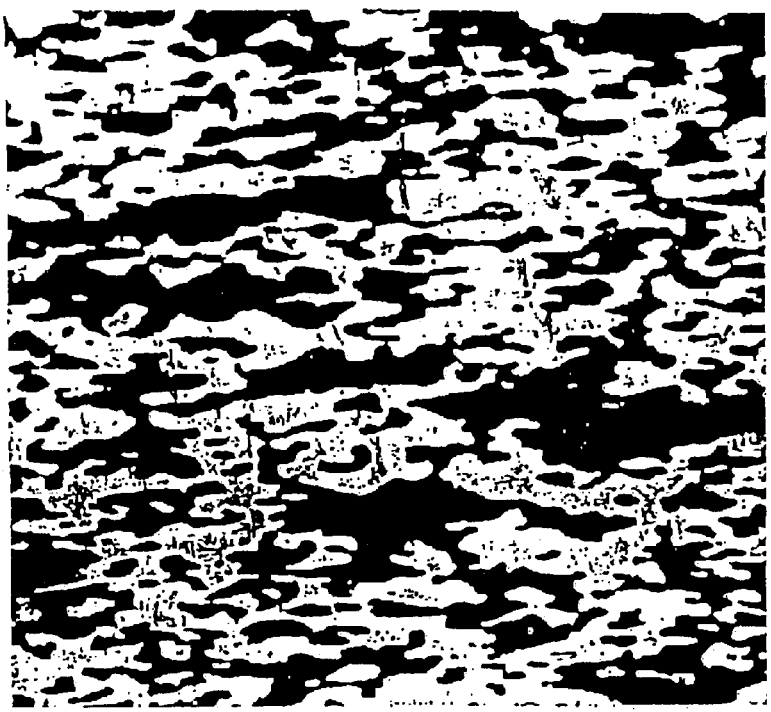
FIG. 4 is an optical photomicrograph showing the microstructure of the forged material (composed of Cu and 55 vol % of $Cu_2O$) in Example 4 of the present invention, the microstructure being that of a plane parallel to the direction of elongation by forging.

FIG. 4 is a photomicrograph (×300) of the microstructure of the forged product. It is noted that both the Cu phase and the $Cu_2O$ phase are deformed and oriented in the forging direction; however, there are no defects such as cracking. It is also noted that 95% or more of $Cu_2O$ particles are dispersed in the form of irregular particles joined together. They are elongated by plastic working.

The sintered body and forged product were measured for thermal conductivity by the laser flash method (Table 2). The sintered body does not show the anisotropism in thermal conductivity. However, the forged product shows the anisotropism in thermal conductivity. The thermal conductivity in the L direction in which the Cu phase and $Cu_2O$ phase are oriented is greater than twice that in the C direction (forging direction) perpendicular to the L direction. The thermal expansivity in the range from room temperature to 300° C. is almost free from anisotropism; it was identical with that in Example 1.

TABLE 2

| | Thermal conductivity (W/m · K) | |
|---|---|---|
| | L direction | C direction |
| Sintered body | 111 | 106 |
| Forged product | 152 | 67 |

EXAMPLE 5

Raw material powders used in this example are electrolytic copper powder (with a particle diameter of 74 μm or less) and CuO powder (with a particle diameter of 1–2 μm and a purity of 3N). They were mixed in a ratio shown in Table 3. The resulting mixture (1400 g) was thoroughly mixed for more than 10 hours in a dry pot mill containing steel balls. The resulting mixed powder was placed in a mold, 150 mm in diameter, and cold-pressed under a pressure of 400–1000 kg/cm² depending on the CuO content. Thus there were obtained preforms, which were subsequently sintered in an argon atmosphere. The resulting sintered bodies were chemically analyzed, examined for structure, and measured for thermal expansivity, and thermal conductivity. They were also tested by X-ray diffractometry to identify oxides therein. Incidentally, sintering was carried out for 3 hours at 900–1000° C. depending on the CuO content. The thermal expansivity was measured in the range of room temperature to 300° C. by using an apparatus for TMA (Thermal Mechanical Analysis). The thermal conductivity was measured by laser flash method. The results are shown in Table 3.

TABLE 3

| No. | Powder composition (vol %) | | Composition of sintered body (vol %) | | Coefficient of thermal expansion (× 10⁻⁶/° C.) | Thermal conductivity (W/m · K) |
|---|---|---|---|---|---|---|
| | Cu | CuO | Cu | Cu₂O | | |
| 11 | 51.2 | 48.8 | 20 | 80 | 5.6 | 55 |
| 12 | 58.1 | 41.9 | 30 | 70 | 7.0 | 80 |
| 13 | 64.9 | 35.1 | 40 | 60 | 8.5 | 105 |
| 14 | 67.8 | 32.2 | 45 | 55 | 9.1 | 129 |
| 15 | 71.4 | 28.6 | 50 | 50 | 9.7 | 149 |
| 16 | 77.6 | 22.4 | 60 | 40 | 10.6 | 185 |
| 17 | 83.5 | 16.5 | 70 | 30 | 12.7 | 228 |
| 18 | 89.2 | 10.8 | 80 | 20 | 13.5 | 282 |

The sintered body was examined by X-ray diffractometry to identify oxides therein. The diffraction peak is due to $Cu_2O$ only. This suggests that CuO has completely transformed into $Cu_2O$ during sintering.

Figure 5:
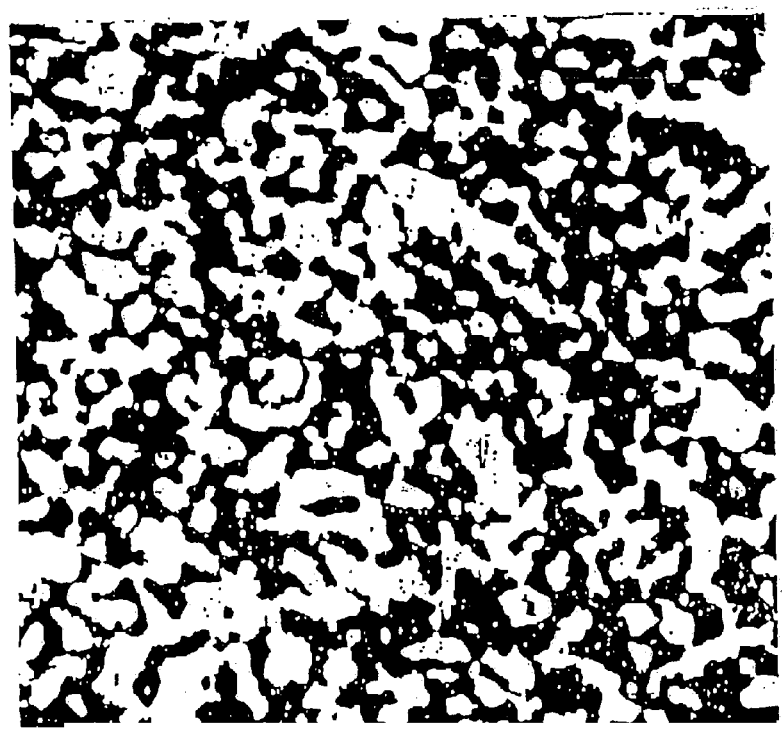
FIG. 5 is an optical photomicrograph showing the microstructure of the sintered body (composed of Cu and 32.2 vol % of CuO) in Example 5 (sample No. 14) of the present invention.

The microstructure of sample No. 14 is shown in FIG. 5. The photomicrograph (×300) indicates that the structure is identical with that of the same composition in Example 1. The $Cu_2O$ phase is composed of $Cu_2O$ (which has formed from Cu and CuO by oxidation) and $Cu_2O$ (which has formed from CuO by decomposition). The $Cu_2O$ particles are identical with those in Example 1.

It is apparent from Table 3 that the sintered body is not so greatly different in thermal expansivity from that produced from $Cu_2O$ powder. However, it is higher in thermal conductivity when its $Cu_2O$ content exceeds 50 vol %. This is because the sintered body has a higher density when it is made of CuO powder.

Figure 6:
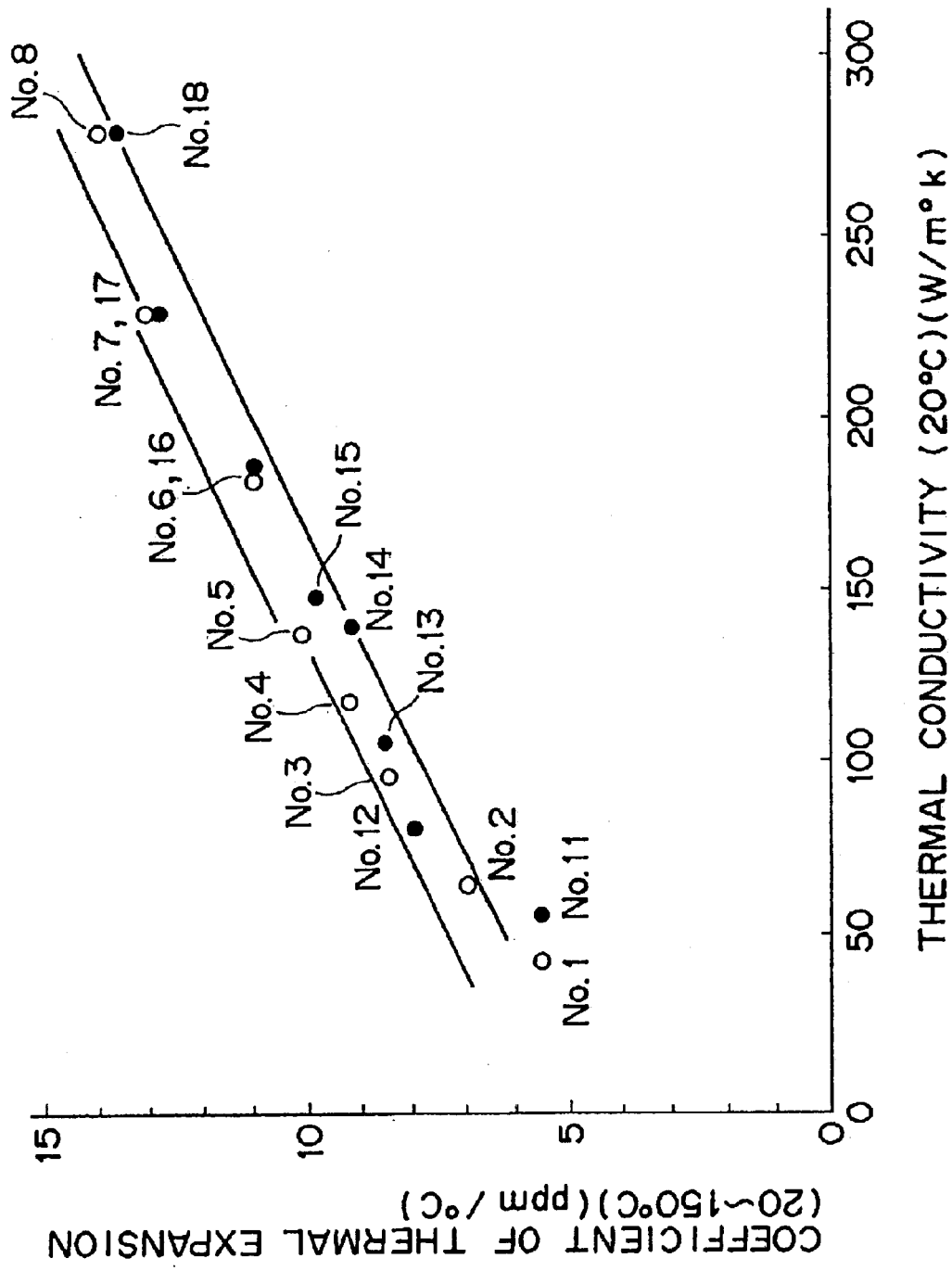
FIG. 6 is a graph showing the relation between thermal expansivity and thermal conductivity.

FIG. 6 is a graph showing the relation between the thermal conductivity (x) and the coefficient of thermal expansion (y) which are shown in Table 3. The plotted points lies between two lines represented by $y=0.031x+4.65$ and $y=0.031x+5.95$. The coefficient of thermal expansion on average should be 0.025–0.035 ppm/° C. per W/m·K at 20° C. in the range of 20–250° C.

EXAMPLE 6

This example demonstrates an application of the copper composite material of the present invention. This application is a radiator plate for the IGBT (Insulated Gate Bipolar Transistor) which in one of power semiconductor elements.

Figure 7:
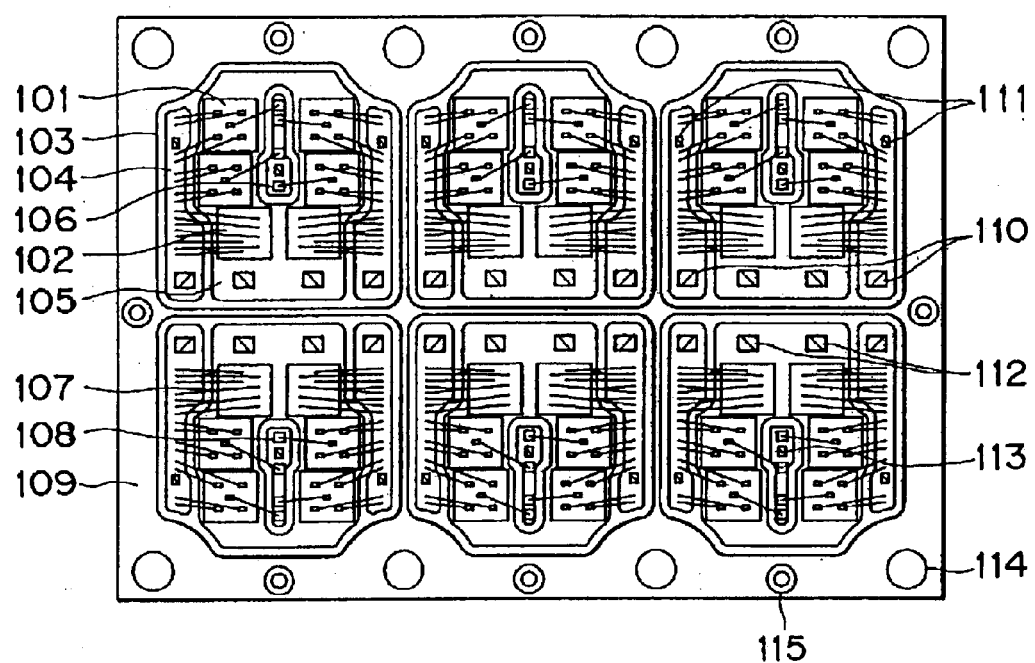
FIG. 7 is a plan view showing the IGBT module in Example 6 of the present invention.
Figure 8:
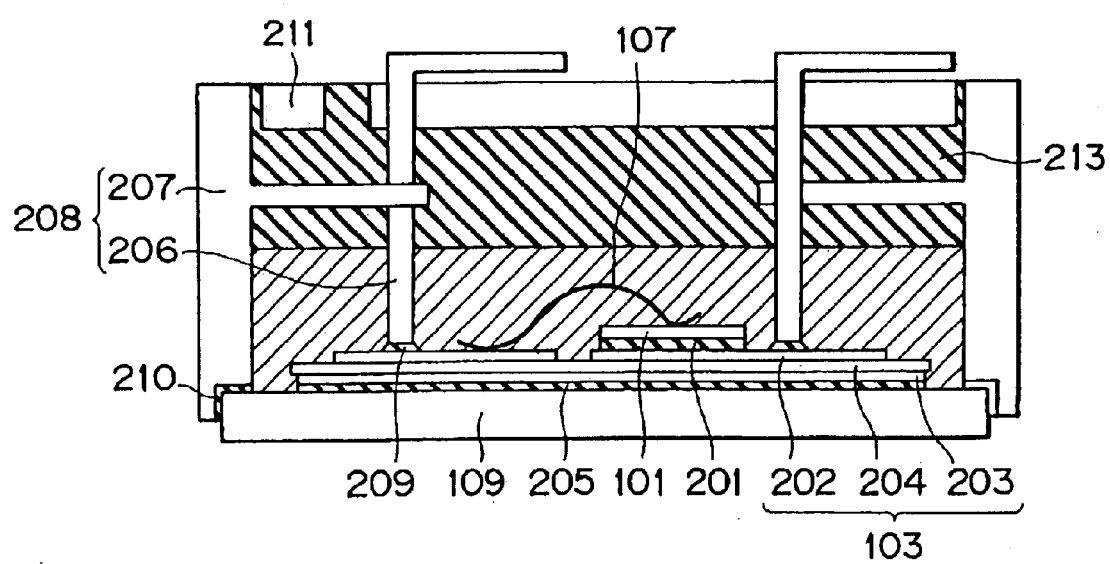
FIG. 8 is a sectional view of the IGBT in Example 6 of the present invention.
Figure 9A:
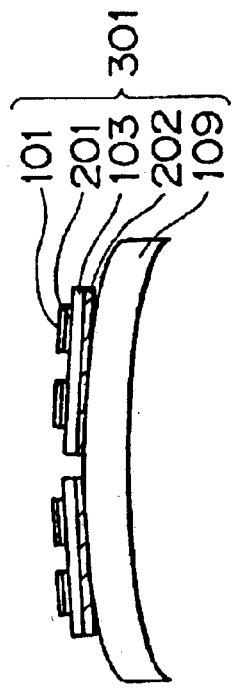
FIGS. 9A to 9D are schematic diagrams showing the steps of production of the IGBT module in Example 6.
Figure 9B:
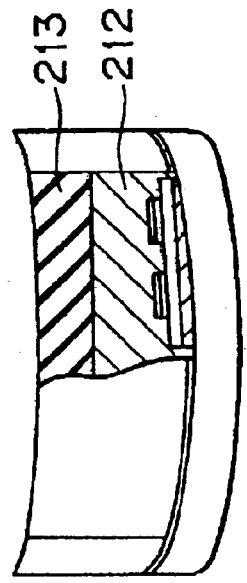
Figure 9C:
Figure 9D:
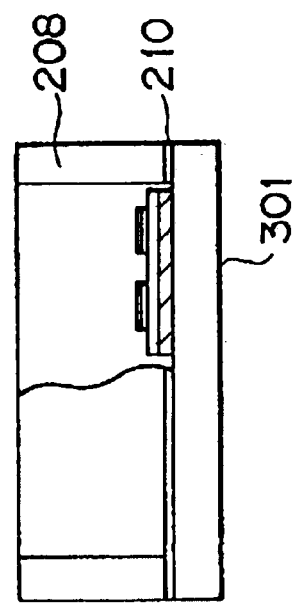

FIG. 7 is a plan view showing the inside of the module consisting of 24 IGBT elements. FIG. 8 is a sectional view of the module of one IGBT. Four IGBT elements 101 and two diode elements 102 are connected to an AlN substrate 103 with solder 201. The AlN substrate 103 consists of two sheets of copper foil 202 and 203 and an AlN plate 204 bonded together with silver solder (not shown). On the AlN substrate 103 are formed regions for the emitter wiring 104, the collector wiring 105, and the gate wiring 106. The IGBT element 101 and the diode element 102 are soldered to the collector wiring 105. Each element is connected to the emitter wiring 104 through the metal wire 107. And, on the region of the gate wiring 106 is arranged the resistance element 108, and the gate pad of the IGBT element 101 is connected to the resistance element 108 through the metal wire 107. Six AlN substrates 103, each carrying semiconductor elements, are bonded to the radiator plate 109 with solder 205. The radiator plate 109, with Ni-plated surface, is made of the Cu—$Cu_2O$ composite material described in Examples 1 to 5. The AlN substrate 103 is connected to the terminal 206 through the solder 209. The terminal 206 and the plastic case 207 together form the base block 208. The case 207 is bonded to the radiator plate 109 with the silicone rubber adhesive 210. The terminals from the case block 208 are connected to each AlN substrate at two emitter terminals 110, two emitter sense terminals 111, two collector terminals 112, and one gate terminal 113. Then, silicone gel 212 is injected through the case lid 211 (having a resin injection port) so that the terminals are entirely covered. Subsequently, thermosetting epoxy resin 213 is poured to cover the entire surface. Thus the module is completed. The radiator plate 109 is attached to the aluminum support by eight bolts passing through eight bolt holes 114. The bolt holes 114 are made by machining. In addition, the case 207 is joined by another eight bolts (joined by the adhesive 210) passing through eight bolt holes 115.

Table 4 shows comparison in thermal expansivity and thermal conductivity between commonly used base materials and the Cu composite material (with 30 vol % $Cu_2O$) according to the present invention. It is noted that the semiconductor element with the Cu—$Cu_2O$ base material has a lower coefficient of thermal expansion than the module with the commonly used Cu base material. The solder 209 joining together the AlN substrate 103 and the base 109 is improved in reliability. The Mo or Al—SiC base used to improve the reliability of the solder 106 in a severe environment has a lower coefficient of thermal expansion than the Cu—$Cu_2O$ base. However, it also has a small thermal conductivity, which leads to a high heat resistance of the module. The module with the Cu—$Cu_2O$ base according to the present invention has more than five times as long heat fatigue life as that with the Cu base and also has 0.8 times the heat resistance of that with the Mo base of the same thickness.

TABLE 4

| Material | Coefficient of thermal expansion (ppm/° C.) | Thermal conductivity (W/m · K) | Remarks |
|---|---|---|---|
| Cu—$Cu_2O$ (30 vol%) | 13.5 | 230 | Present invention |
| Cu | 17 | 390 | Prior art |
| Mo | 5 | 140 | |
| Al—SiC | 8 | 160 | |

The above-mentioned effects broaden the range of selection of module structure and material. For example, in the example shown in FIG. 7, the Cu—$Cu_2O$ base has a higher thermal conductivity than the Mo base. In other words, it is improved in heat diffusion. Therefore, it reduces the temperature difference between the end and the center of the semiconductor element during its operation. The semiconductor element can be made 1.2 times larger than the conventional module. As the result, the conventional structure with 30 units of IGBT is now replaced by a new structure with 24 units of IGBT. In this way it is possible to reduce the module size. In addition, it is now possible to use an alumina substrate (as the insulating substrate) which is lower (by about 20%) in thermal conductivity than an AlN substrate. Alumina is superior in flexural strength to AlN, and hence it can be made into a larger substrate. The alumina plate has a higher coefficient of thermal expansion than the AlN plate, and it differs less in thermal expansion from the base material. This leads to reduction in the amount of warpage of the module itself. The alumina substrate can be made larger in size, and a larger substrate can hold more semiconductor elements. In other words, the aluminum substrate permits reduction of area for insulation in each substrate and reduction of area for insulation between substrates. This leads to reduction in module size.

FIGS. 9A to 9D are schematic diagrams showing the steps of producing the module according to the present invention.
(FIG. 9A) A Cu—$Cu_2O$ base 109 with a nickel-plated surface is made ready. It is nearly flat in its as-purchased state.
(FIG. 9B) To the base 109 is bonded the AlN substrate 103 with solder 205. The AlN substrate carries the semiconductor elements 101 bonded thereto with solder 102. The base 109 warps while the solder is cooling because it differs in thermal expansivity from the assembly of the AlN substrate and the semiconductor elements. Thus the reverse of the module becomes concave.
(FIG. 9C) The case block 208 is assembled with a thermosetting adhesive. While the adhesive is cooling, the reverse of the module becomes almost flat because the case has a higher coefficient of thermal expansion than the assembly 301 which has undergone soldering.
(FIG. 9D) The inside of the module is filled with the silicone gal 212 and the thermosetting epoxy resin 213. The reverse of the module becomes convex because the resin has a high coefficient of thermal expansion.

Figure 10:
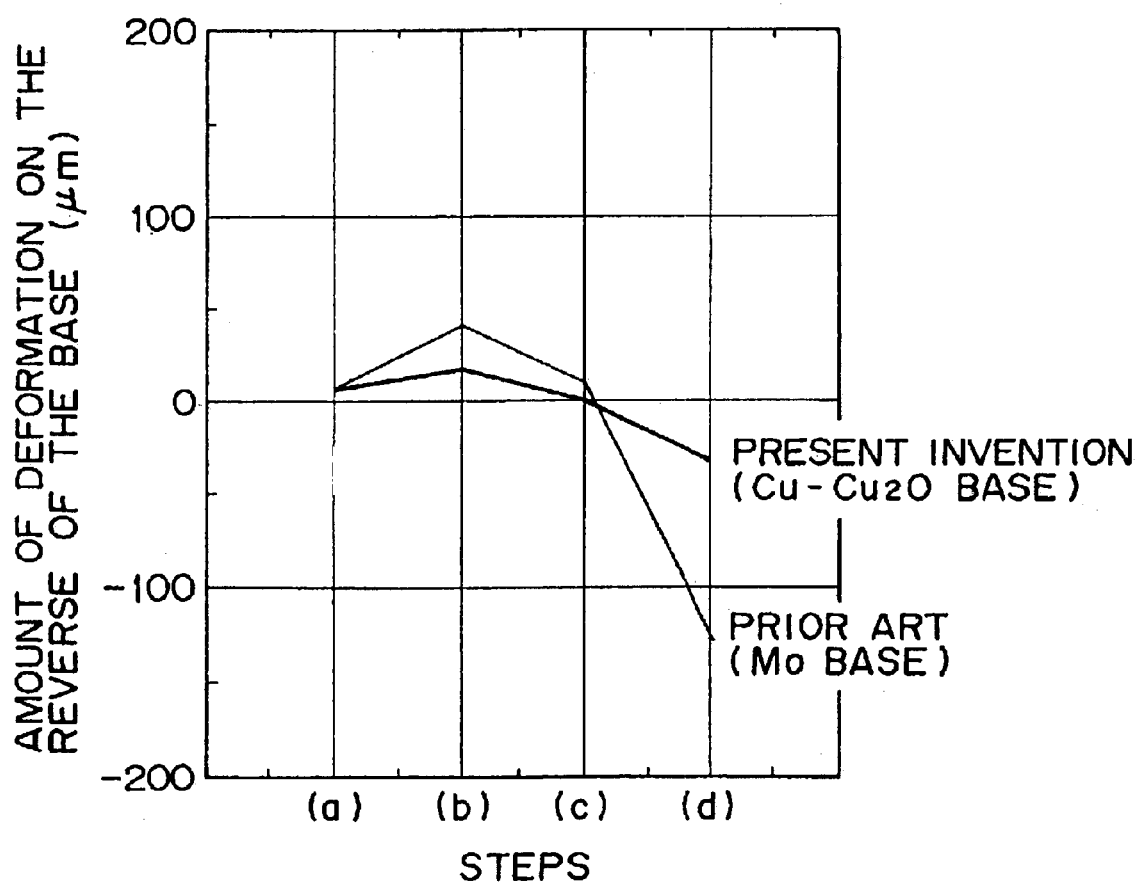
FIG. 10 is a graph showing the amount of warpage of the base in each step of producing the IGBT module in Example 6 of the present invention.

FIG. 10 is a graph showing the amount of warpage of the reverse in each step. The plus value represents concave warpage and the minus value represents convex warpage. The module with the Cu—$Cu_2O$ base according to the present invention warps less (about one-third) than that with the conventional Mo base. The module with the Cu base has the warped concave reverse (100 $\mu$m or more) after its completion because its reverse warps concave in the step (b) due to its great difference in thermal expansivity from the AlN substrate (although the results are not shown). The module with the Cu—$Cu_2O$ base of the present invention has a small amount of warpage; therefore, the module can be made larger than before. Just as the amount of warpage is small in the assembling steps, so the amount of warpage is small due to temperature change during operation. Therefore, the grease between the module and the cooling fin does not flow.

Figure 11:
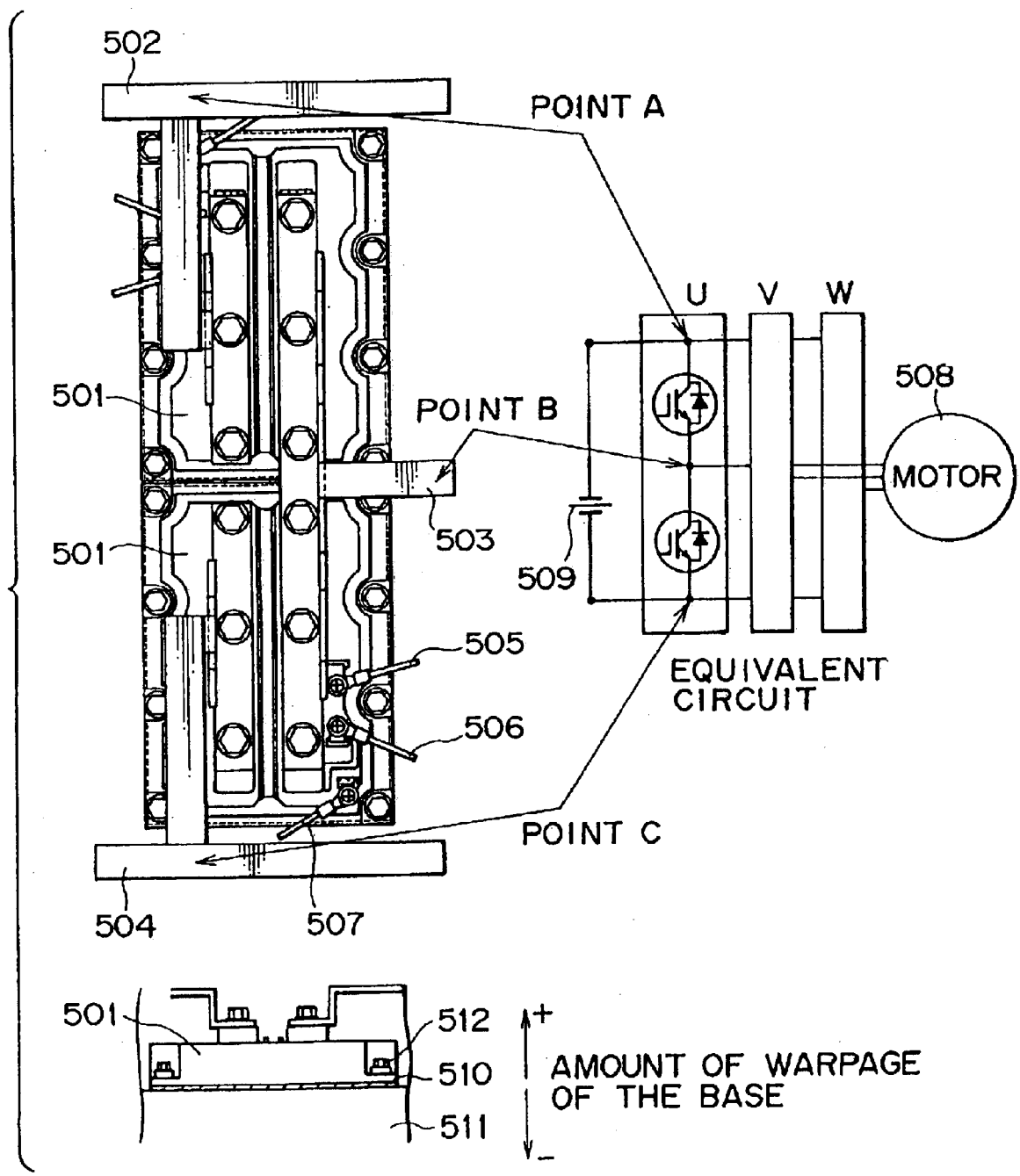
FIG. 11 is a plan view and sectional view showing a power conversion apparatus equipped with the IGBT module in Example 6 of the present invention.

FIG. 11 shows an example of the power conversion apparatus to which the module of the present invention is applied. This example is a 2-level inverter. The power semiconductor device 501 is mounted on the aluminum heat sink 511 and fixed by the tightening bolt 512, with the heat dissipating grease 510 interposed between them. Usually, two modules 501 are arranged symmetrically so that they are connected by a single middle wiring 503 (point B). The collector wiring 502 and the emitter wiring 504 are supplied with source voltage 509 through the U, V, and W phases to which they are connected. The signal wire is constructed of each IGBT module 501, the gate wiring 505, the emitter auxiliary wiring 506, and the collector auxiliary wiring 507. A load is indicated by 508.

Figure 12A:
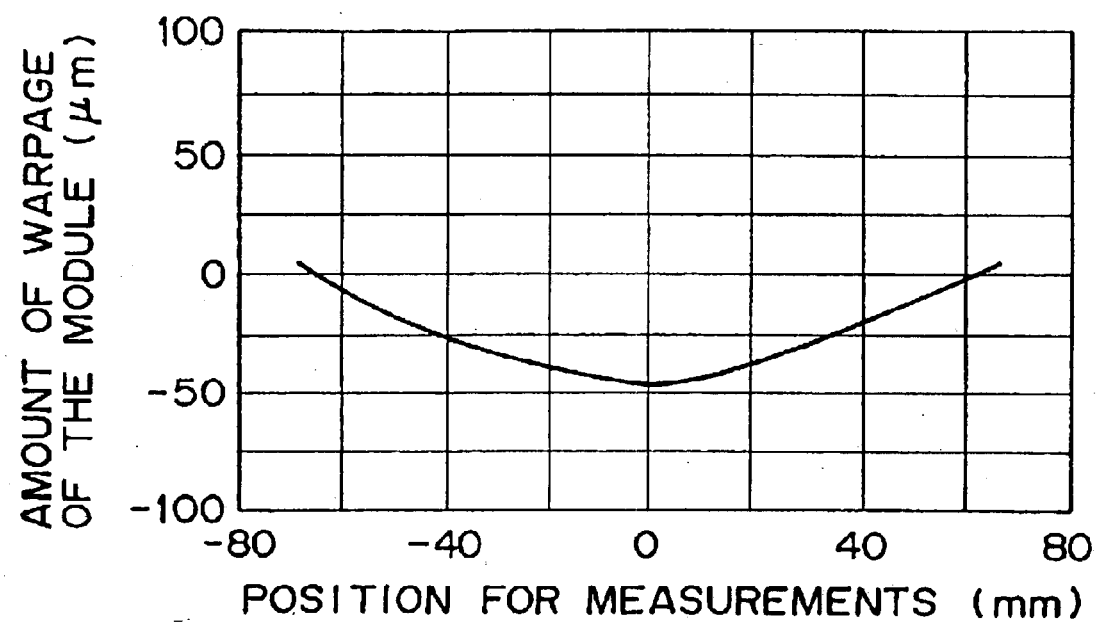
FIGS. 12A and 12B are graphs showing the amount of warpage in a power conversion equipment which is not yet equipped with the IGBT module in Example 6 of the present invention.
Figure 12B:
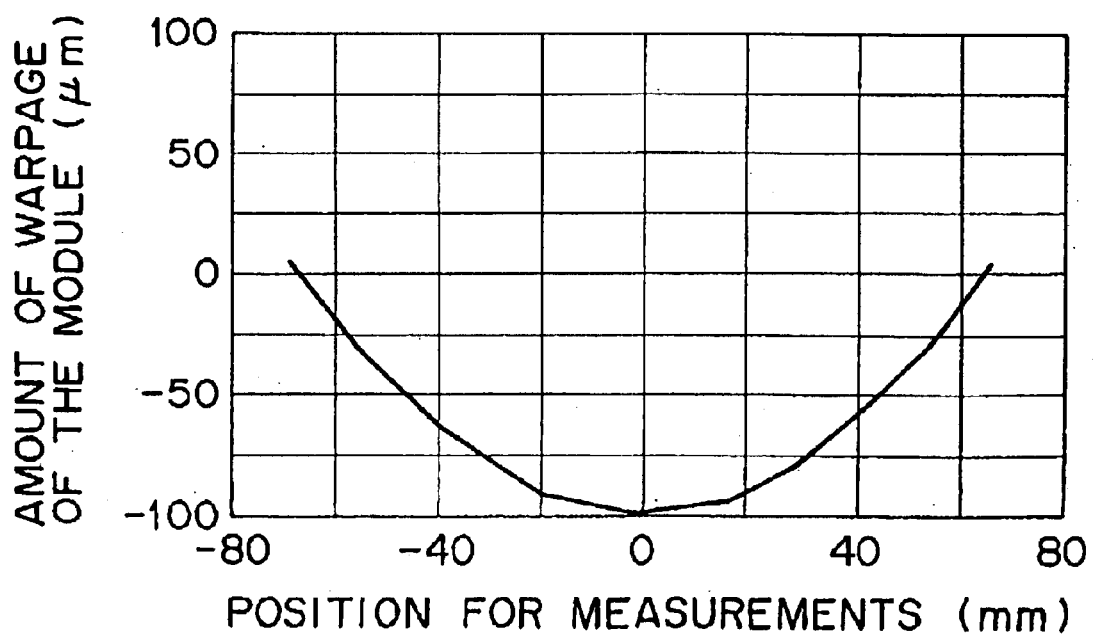
Figure 13A:
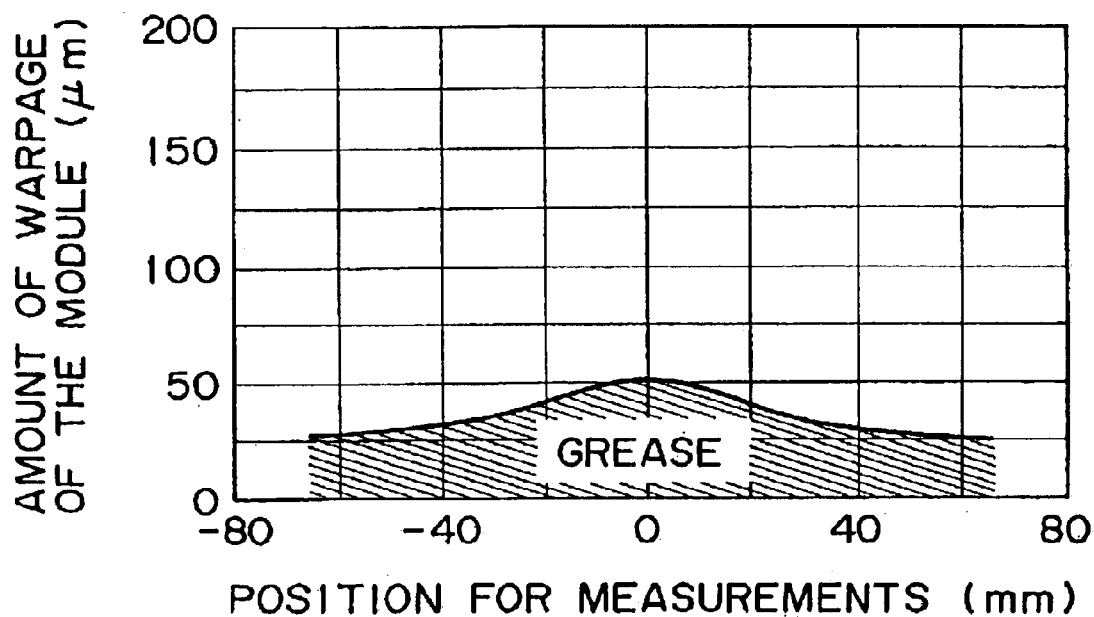
FIGS. 13A and 13B are graphs showing the amount of warpage in a power conversion equipment which has been equipped with the IGBT module in Example 6 of the present invention.
Figure 13B:
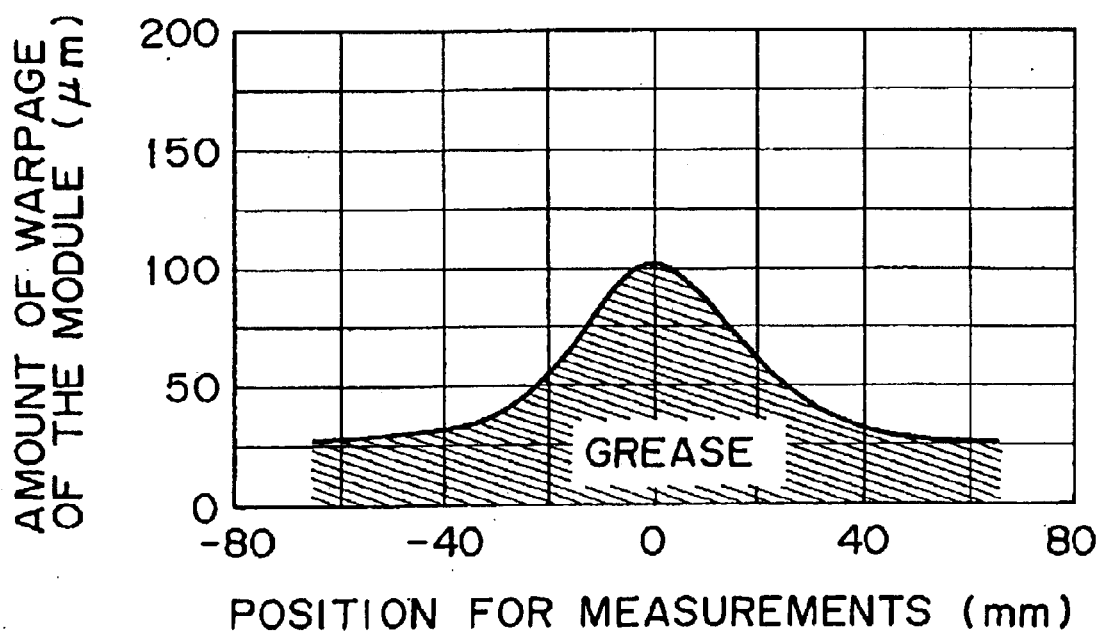

FIGS. 12A and 12B are graphs showing the amount of warpage of the module. FIGS. 13A and 13B are graphs showing the amount of warpage (grease thickness) on the module reverse that was measured before and after the mounted module was tightened. FIGS. 12A and 13A represent the results in the present invention, and FIGS. 12B and 13B represent the results in the prior art technology. In the case of the module with the known conventional Al—SiC base, the amount of warpage (convex) in the reverse is about 100 $\mu$m. However, if the module is coated with grease and then tightened, the warpage is reversed (from convex to concave) because the surface is pushed by grease at the time of tightening. As the result, the thickness of grease increases at the center and the contact resistance increases accordingly. By contrast, in the case of the Cu—$Cu_2O$ base according to the present invention, the amount of initial warpage is about 50 $\mu$m but the thickness of grease at the center of the module remains about 50 $\mu$m after grease application and tightening. This is because the base is highly stiff. Thus the amount of warpage is reduced by half from that of the conventional Al—SiC base. In addition, the grease thickness in the module becomes uniform. Deformation due to pushed grease at the time of mounting occurs in the case of the module with the Cu base having lower stiffness than the Cu—$Cu_2O$ alloy base. This problem is solved by the Cu—$Cu_2O$ alloy of the present invention.

As shown in the figure, the Cu—$Cu_2O$ alloy base of the present invention has lower thermal resistance and contact thermal resistance than the conventional Mo or Al—SiC base material applied to the high-reliability modules. Therefore, it permits the modules to be densely mounted as shown in FIG. 11. In addition, the fact that the cooling fin has improved cooling effect makes it possible to reduce the area and volume required for the mounting of the power conversion apparatus. The reduction of the grease thickness permits the cooling fin to remain flat, and this makes it possible to construct a power conversion apparatus with large-sized fins. In addition, it possible to eliminate the auxiliary cooling function such as forced air cooling. This leads to size reduction and noise reduction.

EXAMPLE 7

Figure 14:
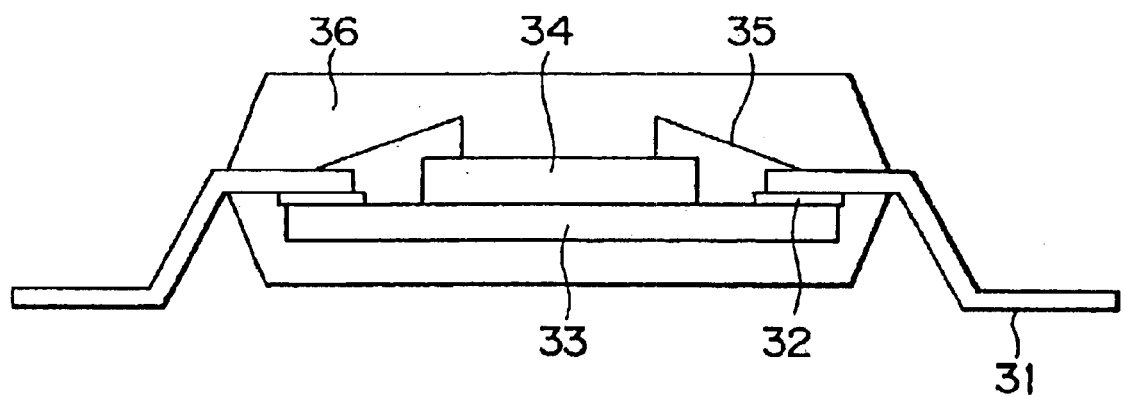
FIG. 14 is a sectional view showing the plastic package with a built-in radiator plate in Example 7 of the present invention.
Figure 15:
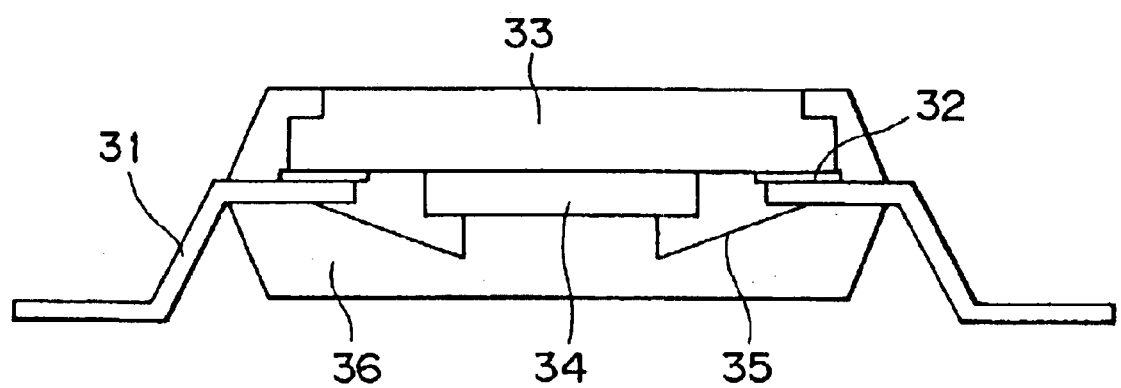
FIG. 15 is a sectional view showing the plastic package with an exposed radiator plate in Example 7 of the present invention.

In this example, the copper composite material of the present invention explained in Examples 1 to 5 is applied to the plastic package containing an IC as shown in FIGS. 14 and 15. FIG. 14 shows a package with a built-in radiator plate. FIG. 15 shows a package with an exposed radiator plate.

The radiator plate is prepared from a Cu—$Cu_2O$ composite material, with the $Cu_2O$ content varied in the range of 20 vol % to 55 vol %. The resulting composite material has a coefficient of thermal expansion in the range of $9 \times 10^{-6}$ to $14 \times 10^{-6}$/° C. at room temperature to 300° C. This coefficient of thermal expansion is close to that of the molding resin. The radiator plate was finally machined and nickel-plated.

The structure of the package will be explained with reference to FIG. 14. There is shown the nickel-plated radiator plate 33 which is made of the copper composite material of the present invention. There is shown the lead frame 31 which is bonded to the radiator plate 33 with the insulating polyimide tape 32. There is shown an IC 34 which is soldered to the radiator plate 33. There is shown an Au wire 35 which connects the Al electrode on the IC to the lead frame. These components, except for part of the lead frame, are sealed with the molding resin 36 which is composed mainly of epoxy resin, silica filler, and hardener. The package with an exposed radiator plate shown in FIG. 15 differs from the package shown in FIG. 14 in that the radiator plate 33 is exposed to outside from the molding resin.

The packages explained above were examined for warpage and cracking at the joint between the radiator plate and the molding resin. It was found that there is no problem if the difference in the coefficient of thermal expansion between the radiator plate and the molding resin is $0.5\times10^{-6}/°$ C. or less. It was also found that the composite material has high thermal conductivity (200 W/m·K) if its $Cu_2O$ content is 20–35 vol %.

EXAMPLE 8

Figure 16:
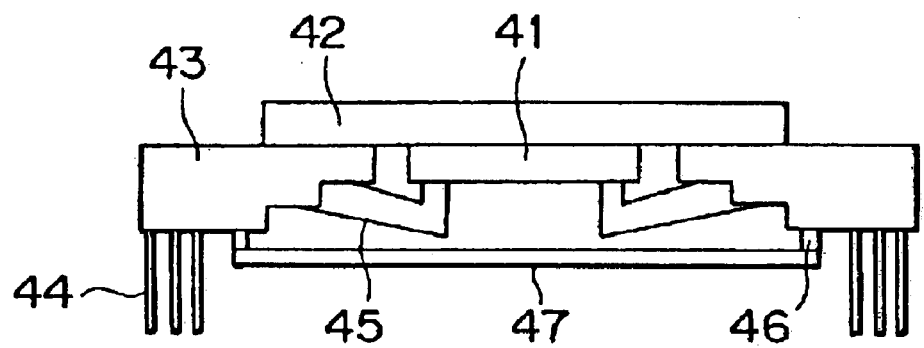
FIG. 16 is a sectional view showing the package in Example 8 of the present invention.
Figure 17:
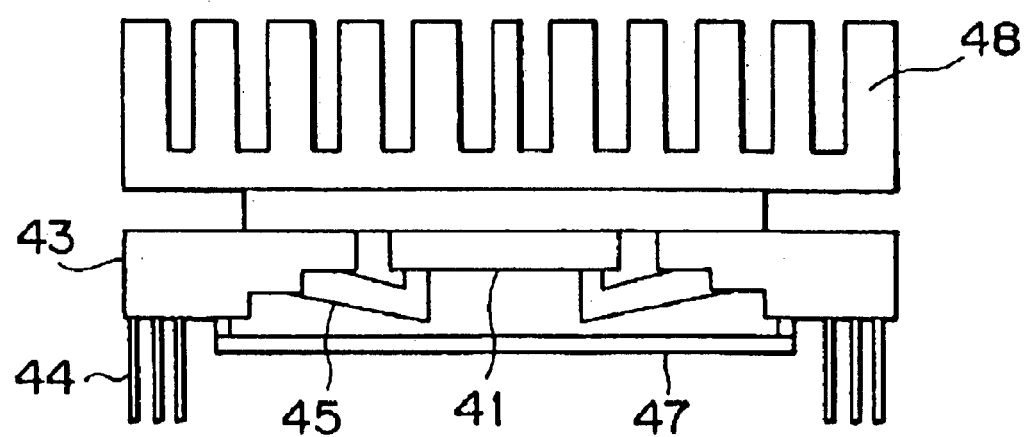
FIG. 17 is a sectional view showing the ceramics package with radiator fins in Example 8 of the present invention.

This example demonstrates an IC ceramics package which is provided with a radiator plate made of the copper composite material of the present invention explained in Examples 1 to 5. FIGS. 16 and 17 are sectional views of the ceramics package. In FIG. 16, there is shown an IC 41 which is bonded to the nickel-plated radiator plate 42 with a polyimide resin. The radiator plate 42 is soldered to the package 43 of $Al_2O_3$. This package has copper wiring and is provided with pins 44 for connection to the circuit board. There is shown an aluminum wire 45 which connects the aluminum electrode on the IC to the package wiring. These components are sealed as follows. A weld ring 46 of kovar alloy is bonded to the package with silver solder. Then, the weld ring is welded to the lid 47 of kovar alloy by using a roller electrode. FIG. 17 shows a ceramics package (the same one as shown in FIG. 16) which is provided with radiator fins 48.

EXAMPLE 9

Figure 18:
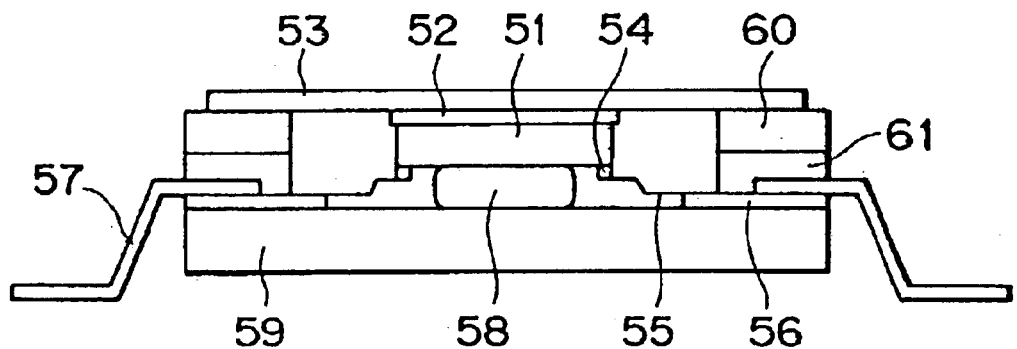
FIG. 18 is a sectional view of the semiconductor device in Example 9 of the present invention.
Figure 19:
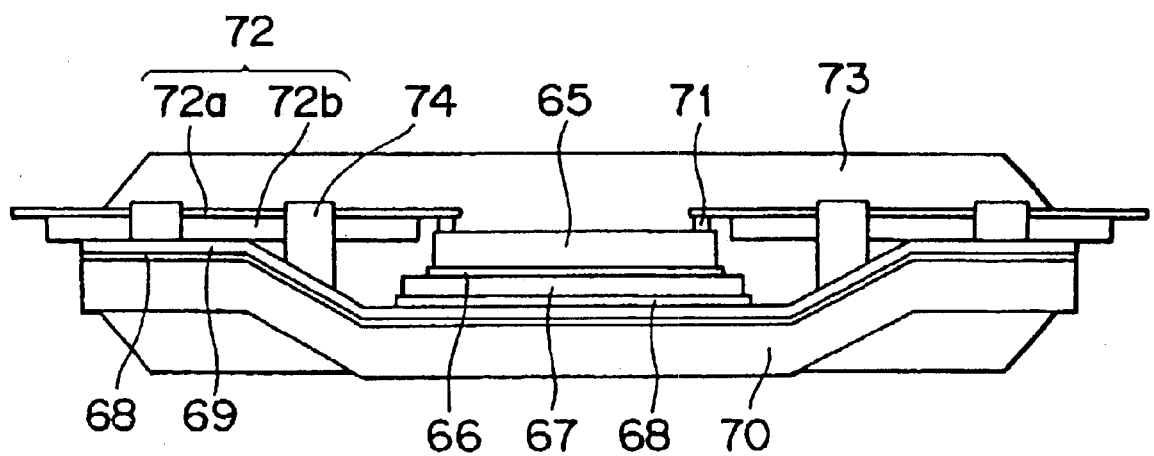
FIG. 19 is a sectional view of the semiconductor device in Example 9 of the present invention.

This example demonstrates a package which is provided with a radiator plate made of the copper composite material of the present invention explained in Examples 1 to 5. This package is formed by TAB (Tape Automated Bonding) technique. FIGS. 18 and 19 are sectional views of the package.

In FIG. 18, there is shown an IC 51 which is bonded to the nickel-plated radiator plate 53 with a heat-conductive resin 52. The IC has terminals at which the Au bump 54 is formed. The Au bump 54 is connected to the TAB 55. The TAB 55 s connected to the lead frame 57 through the thin-film wiring 56. The IC is sealed by the ceramics substrate 59, the frame 60, and the sealing glass 61, with the silicone rubber 58 interposed.

The resin-sealed package is shown in FIG. 19. The IC 65 is bonded to the nickel-plated radiator plate 67 of the present invention with the Au—Si alloy 66. It is further bonded to the copper grounding plate 69 and the nickel-plated radiator plate 70 of the present invention with the heat-conductive resin 68. On the other hand, the terminal of the IC is connected to the TAB 72 though the Au bump 71 and sealed with the resin 73. The lead frame 57 and the radiator plate are partly exposed to outside from the sealing resin. The TAB is fixed to the copper grounding plate with an epoxy-based silver paste 74.

EXAMPLE 10

Figure 20:
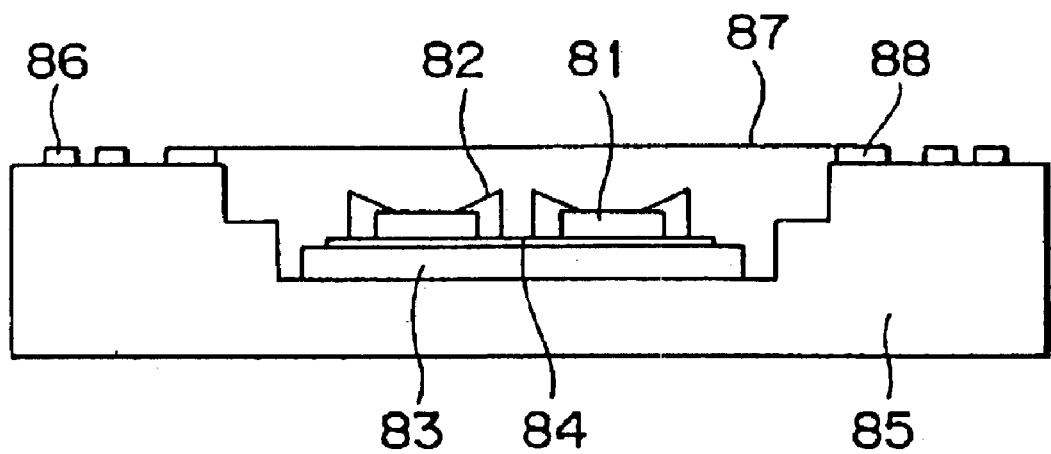
FIG. 20 is a sectional view of MCM in Example 10 of the present invention.

This example demonstrates the MCM having the radiator plate of the copper composite material of the present invention shown in FIGS. 1 to 5. FIG. 20 is a sectional view of the MCM. The radiator plate 83 is formed from a sintered body (with or without rolling) by press working.

The IC 81 is connected through the Au wire 82 to the thin-film wiring 84 formed on the nickel-plated radiator plate 83 of the present invention. It is further connected through the Au wire to the wiring formed on the package 85 made of AlN. It is led to the external terminal 86. The IC is sealed by the lid 87, which is bonded, with the Au—Sn preform 88 interposed between the W metallized layers of the package.

EXAMPLE 11

Figure 21:
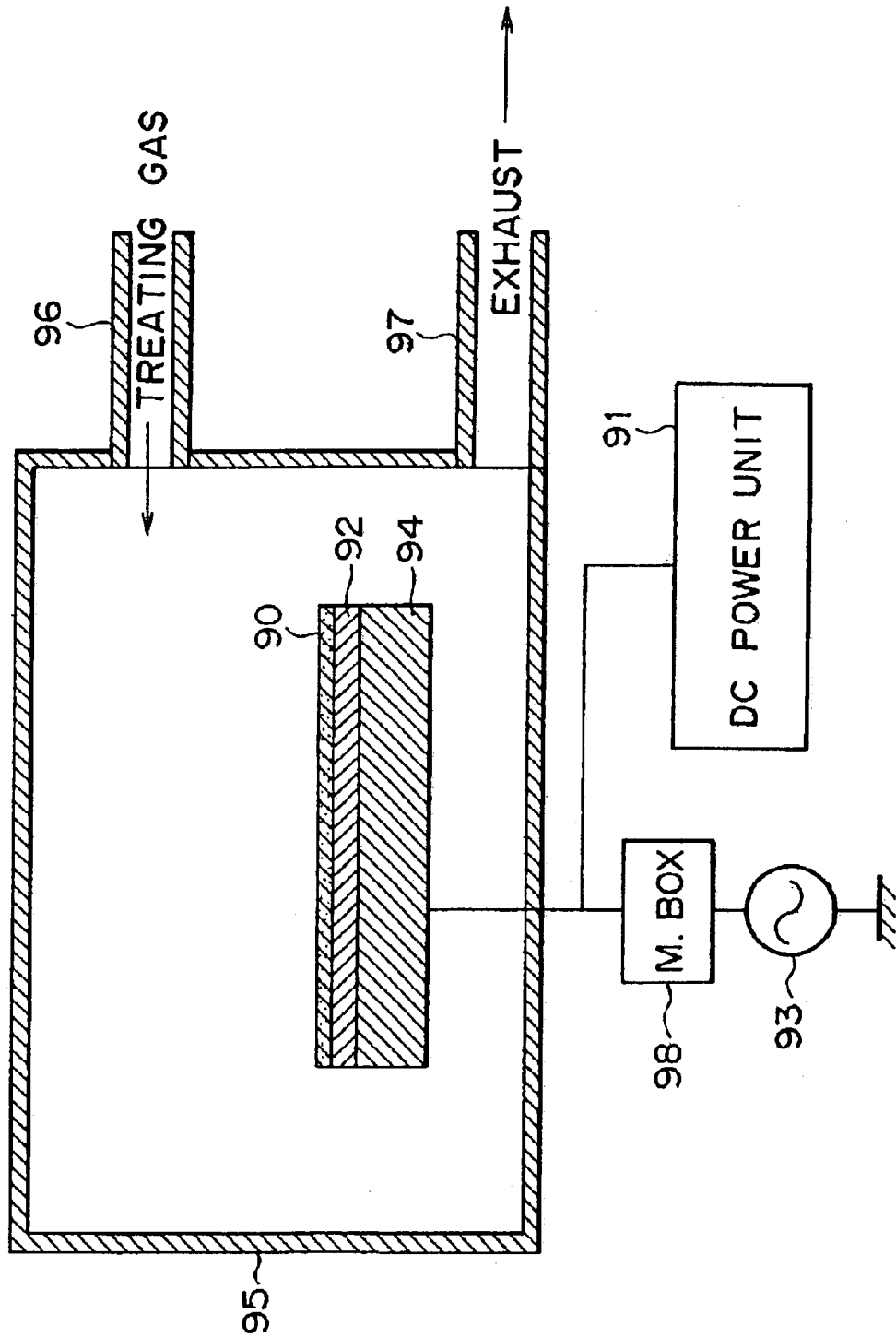
FIG. 21 is a sectional view of the electrostatic attractor pertaining to the present invention.

This example demonstrates the electrostatic attractor equipped with the dielectric plate of the composite material of the present invention. FIG. 21 is its sectional view.

As shown in FIG. 21, the electrostatic attractor is used as a chuck in the sputtering apparatus which processes the work 90 of conductor or semiconductor in a reduced pressure atmosphere in the vacuum chamber 95. When a voltage (about 500V) is applied from the DC power supply 91 to the electrode 94 of the electrostatic attractor, an electrostatic attractive force occurs between the dielectric plate 92 and the work 90. Thus the work 90 is attracted toward the surface of the dielectric plate. In this example, the dielectric is formed from the composite material shown in Example 1 to 5.

In actual sputtering, the work 90 is mounted on the electrostatic attractor. Then, the vacuum chamber 95 is evacuated until the internal pressure decreases to about $1\times10^{-3}$ Pa by means of the vacuum pump connected to the exhaust vent 97. The valve attached to the gas inlet 96 is opened to introduce the reaction gas (argon and the like) into the vacuum chamber 95 at a flow rate of about 10 sccm. The pressure in the vacuum chamber 95 is about $2\times10^{-2}$ Pa.

After that, a high-frequency power (about 4 kW at 13.56 MHz) is supplied to the electrode 94 of the electrostatic attractor, so that plasma is generated between the electrode 94 of the electrostatic attractor and another electrode (not shown). The voltage of the high-frequency power is 2 kV ($V_{DC}$) and 4 kV ($V_{pp}$). The matching box 98, which is inserted between the electrode 94 of the electrostatic attractor and the high-frequency power source 93, is designed for impedance matching with the vacuum chamber so that the high-frequency power is efficiently supplied to the plasma.

In actual operation of this sputtering apparatus, the temperature of the work 90 reached about 450° C. Nevertheless, the dielectric plate 92 of the electrostatic attractor remained unchanged without cracking (which gives rise to foreign matter). This means that the electrostatic attractor is effective in improving the reliability of working.

Incidentally, the electrostatic attractor will produce the same effect as mentioned above when it is applied to any apparatus which is designed to fabricate works of conductor or semiconductor (such as silicon substrate) in a reduced pressure atmosphere. It may be used as a chuck for the chemical vapor deposing apparatus, physical vapor depositing apparatus, milling apparatus, etching apparatus, ion implantation apparatus, or the like.

The electrostatic attractor in this example permits the dielectric plate to improve in heat resistance without impairing its dielectric breakdown strength. If the electrostatic attractor according to the present invention is used as a chuck for the apparatus for fabrication in a reduced pressure, it is possible to reduce the occurrence of foreign matter resulting from the cracking of the dielectric plate.

Industrial Applicability

The composite material of the present invention has low thermal expansivity, high thermal conductivity, and good plastic workability. Therefore, it permits mass production with reduced manufacturing steps.

The composite material of the present invention also has the mixed structure of Cu phase (with extremely high thermal conductivity) and $Cu_2O$ phase (with low thermal expansivity); therefore, it has the characteristics of both of them. The composite material of the present invention will have low thermal expansivity and high thermal conductivity if the Cu content and $Cu_2O$ content are adequately adjusted. The composite material of the present invention will find use as the radiator plate for semiconductor devices and the dielectric plate for the electrostatic attractor.

What is claimed:

1. A semiconductor device comprising:
an insulating substrate with a radiator plate and a semiconductor element mounted on said insulating substrate,
wherein said radiator plate is made of composite material comprised of copper(Cu) and cuprous oxide($CU_2O$), characterized in that said composite material contains said cuprous oxide in an amount of 20–80 vol %.

2. A semiconductor device according to claim 1,
wherein said composite material has a coefficient of thermal expansion of $5\times10^{-6}$ to $14\times10^{-6}/°$ C.

3. A semiconductor device according to claim 1,
wherein said composite material has a thermal conductivity of 30–325 W/m·K in a range of room temperature to 300° C.

4. A semiconductor device according to claim 1,
wherein said composite material has a coefficient of thermal expansion of $5\times10^{-6}$ to $14\times10^{-6}/°$ C. and a thermal conductivity of 30–325 W/m·K in a range of room temperature to 300° C.

5. A semiconductor device according to claim 1,
wherein said composite material has a thermal conductivity in a direction of orientation which is greater than twice that in a direction perpendicular to the direction of orientation.

6. A semiconductor device comprising:
an insulating substrate with a radiator plate and a semiconductor element mounted on said insulating substrate,
wherein said radiator plate is made of composite material comprised of metal and inorganic particles,
wherein said metal is selected from at least one of Au, Ag, Cu and Al,
wherein said inorganic particles is selected from at least one of copper oxide, tin oxide, lead oxide and nickel oxide, and
wherein said inorganic particles are dispersed in said composite material and are obtained by plastic working.

7. A semiconductor device comprising:
a semiconductor element mounted on a radiator plate;
a lead frame joined to said radiator plate; and
metal wiring to electrically connect said lead frame with said semiconductor element,
wherein said semiconductor element is sealed with plastics, and
wherein said radiator plate is made of composite material comprised of copper(Cu) and cuprous oxide($CU_2O$), characterized in that said composite material contains said cuprous oxide in an amount of 20–80 vol %.

8. A semiconductor device according to claim 7,
wherein said composite material has a coefficient of thermal expansion of $5\times10^{-6}$ to $14\times10^{-6}/°$ C.

9. A semiconductor device according to claim 7,
wherein said composite material has a thermal conductivity of 30–325 W/m·K in a range of room temperature to 300° C.

10. A semiconductor device according to claim 7,
wherein said composite material has a coefficient of thermal expansion of $5\times10^{-6}$ to $14\times10^{-6}/°$ C. and a thermal conductivity of 30–325 W/m·K in a range of room temperature to 300° C.

11. A composite material according to claim 7,
wherein said composite material has a thermal conductivity in a direction of orientation which is greater than twice the thermal conductivity in a direction perpendicular to the direction of orientation.

12. A semiconductor device comprising:
a semiconductor element mounted on a radiator plate;
a lead frame joined to said radiator plate; and
metal wiring to electrically connect said lead frame with said semiconductor element,
wherein said radiator plate is made of composite material comprising metal and inorganic particles,
said metal is selected from at least one of Au, Ag, Cu and Al,
said inorganic particles is selected from at least one of copper oxide, tin oxide, lead oxide and nickel oxide, and
said inorganic particles are dispersed in said composite material and are obtained by plastic working.

* * * * *